(12) United States Patent
Chen

(10) Patent No.: US 9,268,380 B2
(45) Date of Patent: Feb. 23, 2016

(54) COMPUTER WITH FORCE SENSING RESISTOR

(71) Applicant: Chih-Ming Chen, New Taipei (TW)

(72) Inventor: Chih-Ming Chen, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 654 days.

(21) Appl. No.: 13/664,630

(22) Filed: Oct. 31, 2012

(65) Prior Publication Data
US 2014/0089689 A1     Mar. 27, 2014

(30) Foreign Application Priority Data
Sep. 21, 2012   (TW) ................... 101134854

(51) Int. Cl.
*H01H 35/00* (2006.01)
*G06F 1/26* (2006.01)
*H03K 17/96* (2006.01)

(52) U.S. Cl.
CPC .............. *G06F 1/26* (2013.01); *H03K 17/9625* (2013.01)

(58) Field of Classification Search
CPC ..... H03K 17/9625; H03K 17/687; G06F 1/26
USPC ........................... 307/119, 115, 116; 345/156
See application file for complete search history.

(56) References Cited

U.S. PATENT DOCUMENTS

| | | | | |
|---|---|---|---|---|
| 4,333,317 A | * | 6/1982 | Sawyer | F25B 41/062 62/212 |
| 6,188,742 B1 | * | 2/2001 | Schousek | G01D 21/00 377/19 |
| 2001/0008351 A1 | * | 7/2001 | Komata | G06F 3/0338 307/119 |
| 2002/0083776 A1 | * | 7/2002 | Tanizawa | 73/753 |
| 2006/0123978 A1 | * | 6/2006 | Kubitz | G09B 15/00 84/600 |
| 2011/0122044 A1 | * | 5/2011 | Sathath | H01Q 1/2266 343/861 |

* cited by examiner

*Primary Examiner* — Rexford Barnie
*Assistant Examiner* — Rasem Mourad
(74) *Attorney, Agent, or Firm* — Novak Druce Connolly Bove + Quigg LLP

(57) ABSTRACT

A computer includes a motherboard with a signal receiving port and a switch circuit. The switch circuit includes a force sensing module and a transistor. The transistor includes a first terminal connected to the force sensing module, a second terminal connected to a power source, and a third terminal connected to the signal receiving port. When there is a pressure applied to the force sensing module, the force sensing module outputs a first driving signal to turn on the transistor and enables the computer to maintain its current power on or off state. When there is no pressure applied to the force sensing module, the force sensing module outputs a second driving signal to turn off the transistor and switches on or off the computer.

12 Claims, 3 Drawing Sheets

COMPUTER WITH FORCE SENSING RESISTOR

BACKGROUND

1. Technical Field

The present disclosure relates to a computer with a force sensing resistor.

2. Description of Related Art

A computer may be turned on or off by pressing a power button installed on a front panel of the computer. The power button may include a movable portion and a resilient member. The movable portion can be pressed by users to turn on or off the computer. The resilient member is able to urge the movable portion to return to its original position. However, the power button has a complicate mechanical structure, which may occupy much space of the computer.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation. In the figures of the accompanying drawings, like references indicate similar elements. It should be noted that references to "an" or "one" embodiment in this disclosure are not necessarily to the same embodiment, and such references mean at least one.

Figure 1:
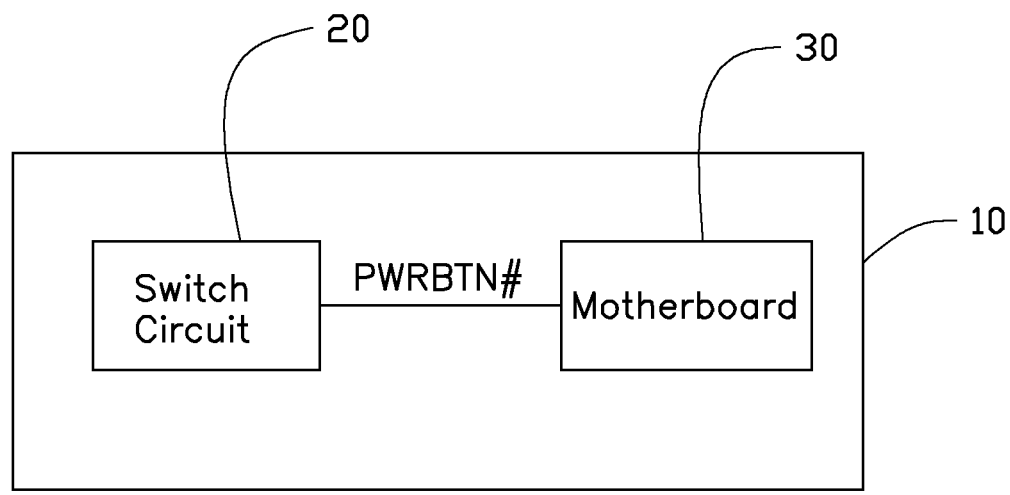
FIG. 1 illustrates a block diagram of a computer in accordance with an embodiment.

Referring to FIG. 1, an embodiment of a computer 10 is shown. The computer 10 includes a switch circuit 20 and a motherboard 30 connected to the switch circuit 20. The switch circuit 20 outputs a power-button-press (PWRBTN#) signal to the motherboard 30 for switching on or off the computer 10.

Figure 2:
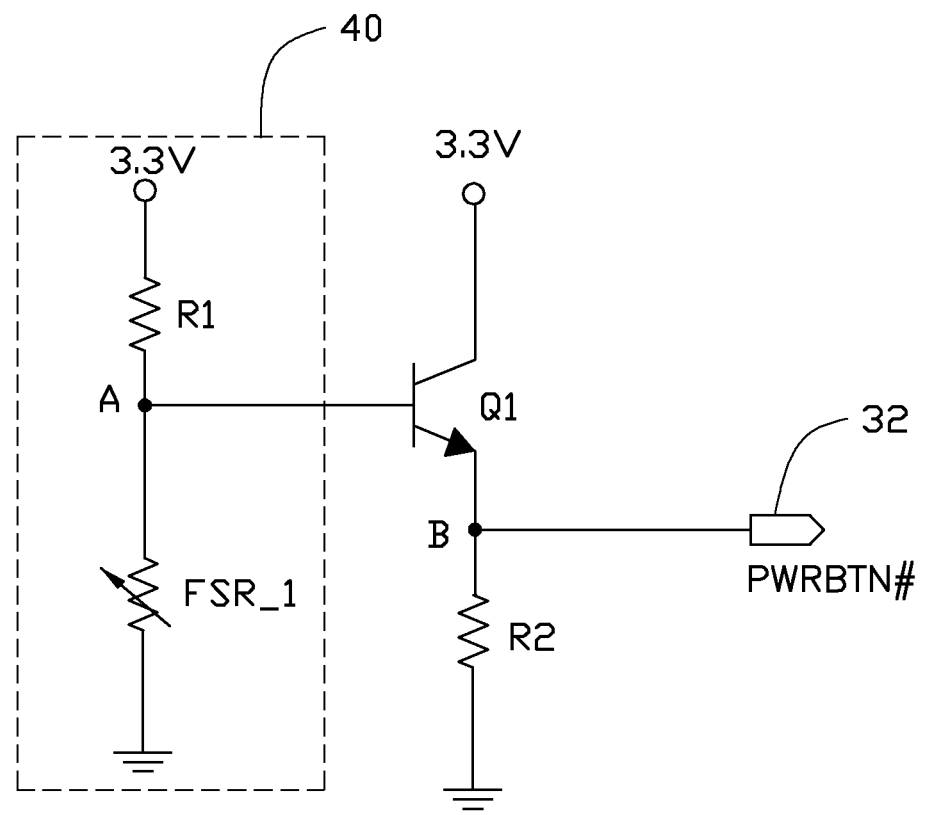
FIG. 2 illustrates a switch circuit of the computer of FIG. 1 in accordance with one embodiment.

FIG. 2 shows in one embodiment of the switch circuit 20. The switch circuit 20 includes a first force sensing module 40. The first force sensing module 40 includes a first resistor R1 and a first force sensing resistor FSR_1. A first end of the first resistor R1 is coupled to a 3.3V power source. A second end of the first resistor R1 is connected to a first node A. A first end of the first force sensing resistor FSR_1 is connected to the first node A. A second end of the first force sensing resistor FSR_1 is connected to ground. The switch circuit 20 further comprises a first transistor Q1 and a second resistor R2. A base terminal of the first transistor Q1 is connected to the first node A. A collector terminal of the first transistor Q1 is coupled to the 3.3V power source. An emitter terminal of the first transistor Q1 is connected to a second node B. A first end of the second resistor R2 is connected to the second node B. A second end of the second resistor R2 is connected to ground. The second node B is connected to a PWRBTN# port 32 of the motherboard 30. In one embodiment, the first transistor Q1 is an NPN type bipolar transistor.

The first force sensing resistor FSR_1 can be mounted into a chassis of the computer 10. A power button label can be put on the chassis and located above the first force sensing resistor FSR_1. When the first force sensing resistor FSR_1 is not pressed by user and the first force sensing resistor FSR_1 is in an original state, a resistance of the first force sensing resistor FSR_1 is much greater than that of the first resistor R1. A voltage at the first node A is at high level (logic 1). The first transistor Q1 is switched on. A voltage at the second node B is at logic 1. Thus, the PWRBTN# signal is at logic 1 and the computer 10 maintains a current power on or off state. When the first force sensing resistor FSR_1 is pressed by user, the resistance of the first force sensing resistor FSR_1 decreases and becomes less than that of the first resistor R1. The voltage at the first node A is pulled to low level (logic 0). The first transistor Q1 is switched off. The voltage at the second node B is at logic 0. Thus, the PWRBTN# signal is at logic 0 and the computer 10 is switched on or off.

Figure 3:
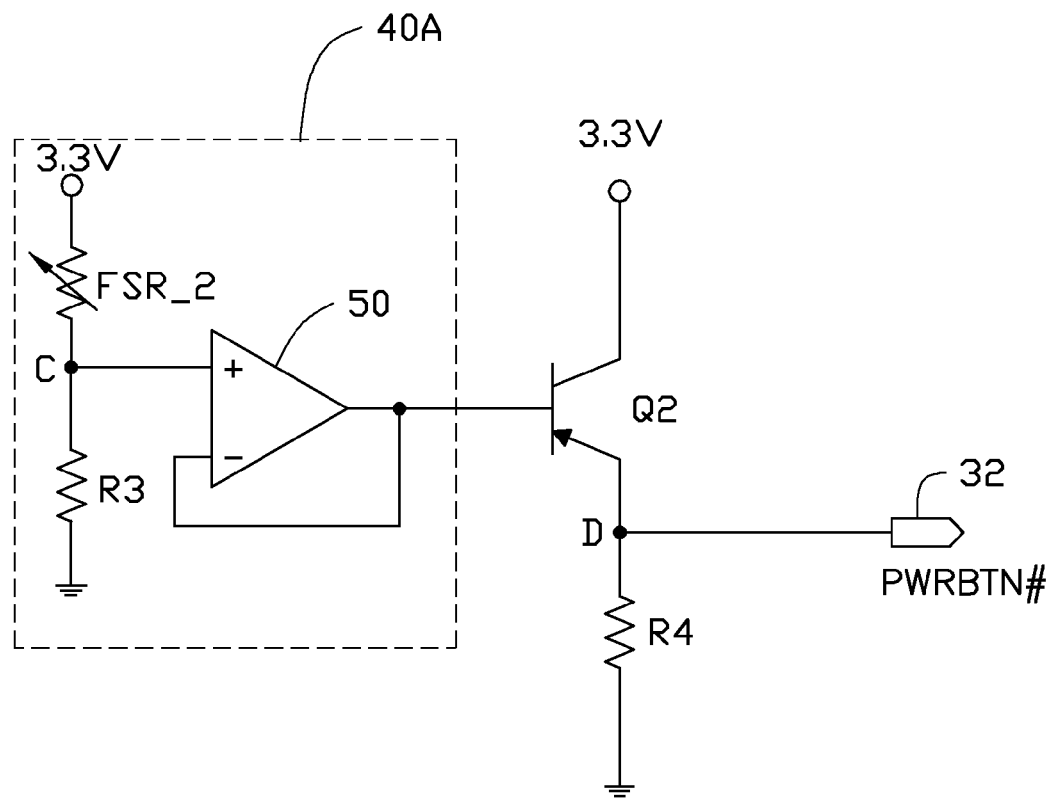
FIG. 3 illustrates a switch circuit of the computer of FIG. 1 in accordance with another embodiment.

Referring to FIG. 3, in another embodiment, the switch circuit 20 includes a second force sensing module 40A. The second force sensing module 40A includes a second force sensing resistor FSR_2, a third resistor R3, and an amplifier 50. A first end of the second force sensing resistor FSR_2 is coupled to a 3.3V power source. A second end of the second force sensing resistor FSR_2 is connected to a third node C. A first end of the third resistor R3 is connected to the node C. A second end of the third resistor R3 is connected to ground. A positive input terminal of the amplifier 50 is connected to the third node C. A negative input terminal of the amplifier 50 is connected to an output terminal of the amplifier 50. The switch circuit 20 further includes a second transistor Q2 and a fourth resistor R4. A base terminal of the second transistor Q2 is connected to the output terminal of the amplifier 50. A collector terminal of the second transistor Q2 is connected to the 3.3V power source. An emitter terminal of the second transistor Q2 is connected to a fourth node D. A first end of the fourth resistor R4 is connected to the fourth node D. A second end of the fourth resistor R4 is connected to ground. The fourth node D is connected to the PWRBTN# port 32 of the motherboard 30.

The amplifier 50 functions as a buffer in the switch circuit. A voltage on the positive terminal of the amplifier 50 is equal to that on the output terminal of the amplifier 50. When the second force sensing resistor FSR_2 is not pressed by a user, a resistance of the second force sensing resistor FSR_2 is much greater than that of the third resistor R3. A voltage at the third node C is at logic 0. The output terminal of the amplifier 50 is at logic 0. The second transistor Q2 is switched on. A voltage at the fourth node D is at logic 1. Thus, the PWRBTN# signal is at logic 1 and the computer 10 maintains a current power on or off state. When second first force sensing resistor FSR_2 is pressed by user, the resistance of the second force sensing resistor FSR_2 decreases and becomes less than that of the third resistor R3. The voltage at the third node C is pulled up to logic 1. The output terminal of the amplifier is at logic 1. The second transistor Q2 is switched off. The voltage at the fourth node D is at logic 0. Thus, the PWRBTN# signal is at logic 0 and the computer 10 is switched on or off.

In above embodiments, the first transistor Q1 and the second transistor Q2 function as switches which can be replaced by other transistors, such as field-effect transistors. Other force sensors can also replace the force sensing resistors.

While the present disclosure has been illustrated by the description in this embodiment, and while the embodiment has been described in considerable detail, it is not intended to restrict or in any way limit the scope of the appended claims to such details. Additional advantages and modifications within the spirit and scope of the present disclosure will readily appear to those skilled in the art. Therefore, the present disclosure is not limited to the specific details and illustrative examples shown and described.

What is claimed is:

1. A computer comprising:
   a motherboard with a signal receiving port;
   a switch circuit comprising a force sensing module and a transistor, the transistor comprises a first terminal connected to the force sensing module, a second terminal connected to a power source, and a third terminal connected to the signal receiving port;
   wherein when no pressure is applied to the force sensing module, the force sensing module outputs a first driving signal to turn on the transistor, and the third terminal sends a first signal to the signal receiving port to keep a power on or off state of the computer unchanged; and when a pressure is applied to the force sensing module, the force sensing module outputs a second driving signal to turn off the transistor, and the third terminal sends a second signal to the signal receiving port to switch off or on the computer accordingly;
   wherein the force sensing module comprises a force sensing resistor of which a resistance decreases when there is a pressure applied thereto, the force sensing module further comprises an amplifier connected between the force sensing resistor and the transistor and a third resistor, which is connected to the force sensing resistor in series, a positive input terminal of the amplifier is connected to a third node, a negative input terminal of the amplifier is connected to an output terminal of the amplifier, a first end of the force sensing resistor is connected to the power source, and a second end of the force sensing resistor is connected to the third node; the first terminal of the transistor is connected to the output terminal of the amplifier; a first end of the third resistor is connected to the third node, and a second end of the third resistor is grounded.

2. The computer of claim 1, wherein the force sensing module further comprises a first resistor, a first end of the first resistor is connected to the power source, and a second end of the first resistor is connected to a first node, the first terminal is connected to the first node; a first end of the force sensing resistor is connected to the first node, and a second end of the force sensing resistor is connected to ground.

3. The computer of claim 2, wherein the transistor is an NPN type bipolar transistor, the first terminal is a base terminal, the second terminal is a collector terminal, and the third terminal is an emitter terminal.

4. The computer of claim 3, wherein the switch circuit further comprises a second resistor, a first end of the second resistor is connected to the emitter terminal, and a second end of the second resistor is connected to ground.

5. The computer of claim 1, wherein the transistor is a PNP type bipolar transistor, the first terminal is a base terminal, the second terminal is a collector terminal, and the third terminal is an emitter terminal.

6. The computer of claim 5, wherein the switch circuit further comprises a fourth resistor, a first end of the fourth resistor is connected to the emitter terminal, and a second end of the fourth resistor is connected to ground.

7. The computer of claim 1, wherein the first signal is at high level, the second signal is at low level, and a level of the first driving signal is opposite to that of the second driving signal.

8. A computer, comprising a circuit, the circuit comprises:
   a force sensing module comprising a force sensor and a first resistor connected to the force sensor in series, each of the force sensor and the first resistor connected to a node; and
   a transistor comprising a first terminal connected to the node, a second terminal connected to a power source, and a third terminal connected to ground via a second resistor, the third terminal used to send a PWRBTN signal to switch or maintain a power on or off state of the computer;
   wherein when no pressure is applied to the force sensor, the force sensing module outputs a first driving signal to turn on the transistor, and the third terminal sends a first PWRBTN signal to keep a power on or off state of the computer unchanged; when there is a pressure applied to the force sensor, the force sensing module outputs a second driving signal to turn off the transistor, and the third terminal sends a second PWRBTN signal to switch off or on the computer;
   wherein the force sensor is a force sensing resistor of which a resistance decreases when there is a pressure applied thereto, a first end of the force sensing resistor is connected to the power source, and a second end of the force sensing resistor is connected to the node; a first end of the first resistor is connected to the node, and a second end of the first resistor is connected to ground, the force sensing module further comprises an amplifier connected between the force sensing resistor and the transistor, a positive input terminal of the amplifier is connected to the node, a negative input terminal of the amplifier is connected to an output terminal of the amplifier, the first terminal of the transistor is connected to the output terminal of the amplifier.

9. The circuit of claim 8, wherein a first end of the first resistor is connected to the power source, and a second end of the first resistor is connected to the node; a first end of the force sensing resistor is connected to the node, and a second end of the force sensing resistor is connected to ground.

10. The circuit of claim 9, wherein the transistor is an NPN type bipolar transistor, the first terminal is a base terminal, the second terminal is a collector terminal, and the third terminal is an emitter terminal.

11. The circuit of claim 8, wherein the transistor is a PNP type bipolar transistor, the first terminal is a base terminal, the second terminal is a collector terminal, and the third terminal is an emitter terminal.

12. The circuit of claim 8, wherein the first PWRBTN signal is at high level, the second PWRBTN signal is at low level, and a level of the first driving signal is opposite to that of the second driving signal.

* * * * *